United States Patent [19]

Aoai et al.

[11] Patent Number: 5,110,709
[45] Date of Patent: May 5, 1992

[54] LIGHT-SENSITIVE POSITIVE WORKING COMPOSITION CONTAINING A PISOLFONE COMPOUND

[75] Inventors: Toshiaki Aoai; Tadayoshi Kokubo, both of Shizuoka, Japan

[73] Assignee: Fuji Photo Film Co., Ltd., Minami-Ashigara, Japan

[21] Appl. No.: 680,733

[22] Filed: Apr. 5, 1991

[30] Foreign Application Priority Data

Apr. 6, 1990 [JP] Japan ................................. 1-91832

[51] Int. Cl.$^5$ .............................................. G03C 1/76
[52] U.S. Cl. ................................... 430/271; 430/311; 430/313; 430/326; 522/53
[58] Field of Search .............. 430/271, 326, 311, 319; 522/59

[56] References Cited

U.S. PATENT DOCUMENTS

| | | | |
|---|---|---|---|
| 4,330,671 | 5/1982 | Pampalone | 430/326 |
| 4,822,719 | 4/1989 | Schneller et al. | 430/326 |
| 4,853,314 | 8/1989 | Ruckert et al. | 430/326 |
| 4,869,995 | 9/1989 | Shirai et al. | 430/326 |
| 4,931,329 | 6/1990 | Brunsitoli et al. | 430/326 |
| 4,950,582 | 8/1990 | Aoai et al. | 430/326 |

Primary Examiner—Jack P. Brammer
Attorney, Agent, or Firm—Burns, Doane, Swecker & Mathis

[57] ABSTRACT

A positive working light-sensitive composition which comprises:
(a) 10 to 95% by weight of a compound which has at least one acid-decomposable group and whose solubility in an alkaline developer increases by the action of an acid,
(b) 0.01 to 20% by weight of a disulfone compound represented by the formula (I):

$$R^1-SO_2-SO_2-R^2 \qquad (I)$$

wherein $R^1$ and $R^2$ may be same or different and represent substituted or unsubstituted alkyl groups, substituted or unsubstituted alkenyl groups or substituted or unsubstituted aryl groups, and
(c) 3 to 85% by weight of a water-insoluble but alkaline water-soluble resin,
wherein the optical density at 248 nm of 1 μm thick coating of the composition is not more than 1.4 and the optical density at 248 nm of the coating exposed to light of 248 nm is less than the optical density of the coating before exposed to light.

The light-sensitive composition is highly responsive to light of Deep-UV regions and excellent in image resolution.

15 Claims, No Drawings

LIGHT-SENSITIVE POSITIVE WORKING COMPOSITION CONTAINING A PISOLFONE COMPOUND

BACKGROUND OF THE INVENTION

The present invention relates to a light-sensitive composition which comprises an alkali-soluble resin, a compound which is decomposed by an acid and is made alkali-soluble and a specific compound which generates an acid upon irradiation with actinic rays or radiant rays, and which is sensitive to radiation such as ultraviolet rays, far ultraviolet rays, electron rays, molecular beam, γ-rays and synchrotron radiation. In particular, the present invention relates to a photoresist, especially a photoresist composition suitable for fine processing which is high in image resolution and sensitivity and excellent in storage stability.

The photoresist of the present invention is applied to a substrate such as a semiconductor wafer, glass, ceramic and metal by a spin coating or a roller coating in thickness of 0.5 to 3 μm, which is then heated and dried, and imagewise exposed to light through an exposure mask having an image such as a circuit pattern to form a positive image. Further, the positive image is used as a mask to etch the substrate to make the pattern on the substrate. Typical applications include a process for the production of a semiconductor element such as integrated circuits (IC), a process for the production of a circuit board such as liquid crystal and thermal head and other photofabrication processes.

As so-called positive working photoresists, there have been used compositions comprising an alkali-soluble resin and a naphthoquinonediazide compound as a light-sensitive material. For example, novolak phenol resin/naphthoquinone diazide substituted compounds are disclosed in U.S. Pat. Nos. 3,666,473, 4,115,128 and 4,173,470 and as the most typical composition, an example of novolak resin comprising cresolformaldehyde/-trihydroxy benzophenone-1,2-naohthoquinonediazide sulfonic acid ester is disclosed in L. F. Thompson "Introduction to Microlithography" (ACS Publishing, No. 2, 19, pp. 112–121).

Novolak resins used as a binder are suitable for this applications because they are soluble in alkaline water without swelling and highly resistant to plasma etching when the resulting resist image is used as a mask for the etching. Naphthoquinonediazide compounds are suitable for a light-sensitive material of the positive working photoresist because they change their property upon light exposure, i.e., they serve as a dissolution inhibitor to reduce alkali-solubility of the novolak resins but upon exposure to light, they decompose to form an alkali-soluble substance and serve as an accelerator to enhance alkali-solubility of the novolak resins.

There have been developed and practically used a number of positive working photoresists comprising novolak resins and naphthoquinonediazide compounds and sufficient results have been obtained for the processing of patterns having lines of 1.5 to 2.0μm in width.

However, the packaging density of integrated circuits becomes higher and higher. It is required the processing of ultrafine patterns having lines of not more than 1 μm in width in the production of substrates for semiconductor such as ultra LSI. In these applications, such photoresists are required that are high in image resolution, high in pattern reproduction to faithfully reproduce a pattern of an exposure mask, high in sensitivity from the view point of high productivity and excellent in storage stability.

There have been attempts to increase the content of quinonediazide light-sensitive radicals so as to obtain high image resolution. For example, J.P.KOKAI No. Sho 60-158440 discloses the use of a light-sensitive compound containing a higher amount of triester and J.P.KOKAI No. Sho 61-118744 discloses the attempt to increase the number of quinondiazide light-sensitive radicals contained in one molecule of a light-sensitive compound.

However, these light-sensitive compounds have disadvantages that they are insoluble in a solvent conventionally used, or soluble but form deposits during the storage of the photoresist compositions, which cause troubles in a photofabrication process or a device production process and reduce the yield (i.e., the number of IC chips obtained from one piece of silicon wafer). In order to prevent the deposition of the light-sensitive composition, J.P.KOKAI No. Sho 61-260239 discloses the use of an organic solvent having a solubility parameter of 11 to 12. However, since such a solvent as dimethyl sulfoxide is used, the resist composition is low in storage stability, i.e., the sensitivity and image resolution are significantly reduced over time.

It is also considered to use a light source emitting light of shorter wavelength so as to attain high image resolution. For instance, there have been studied to use conventional g-ray (436 nm), i-ray (365 nm), Deep-UV rays (200–300 nm) and KrF excimer laser (248 nm). In order to form a resist pattern having a good shape using the above-mentioned light sources, it is required that a resist composition is low in the absorption of light in these wavelength regions and high in bleaching property ("bleaching" means the reduction in the intrinsic absorption of a substance, in particular herein the reduction in the absorption in Deep-UV regions when exposed to light of Deep-UV regions, e.g., 248 nm) at the wavelength of light exposed. However, naphthoquinonediazide light-sensitive materials conventionally used are high in the absorption of light in Deep-UV regions and low in bleaching property at the wavelength and therefore they are insufficient to meet the requirements to make the wavelength of a light source shorter.

These quinonediazide compounds are decomposed by irradiation with actinic rays to form 5-membered carboxylic acids and they are thus made alkali-soluble. In these applications of the light-sensitive material, such properties of the compounds are utilised. However, their light-sensitivity is insufficient. This stem from the fact that their quantum yield essentially never exceeds 1.

Many attempts have been made to improve the light-sensitivity of light-sensitive compositions containing quinonediazide compounds. However, it is very difficult to improve the light-sensitivity while maintaining the development latitude during development.

On the other hand, there have been proposed some positive working light-sensitive compositions free of quinonediazide compounds. One example thereof comprises a polymeric compound having o-nitrocarbinol ester groups as disclosed in J.P. KOKOKU No. Sho 56-2696. However, such a composition does not provide high sensitivity for the same reasons as those discussed above in connection with quinonediazide compounds.

Separately, there have been proposed methods to improve light-sensitivity using a light-sensitive system which is catalytically activated, wherein a known principle is used that a photolytically generated acid causes a second reaction which makes resist in exposed areas soluble. Examples of the methods include combinations of photolytically acid producing compound and acetal or O- or N-acetal compound (J.P.KOKAI No. Sho 48-89003), orthoester or amideacetal compound (J.P.KOKAI No. Sho 51-120714), polymer having in the main chain acetal or ketal groups (J.P.KOKAI No. Sho 53-133429), enolether compound (J.P.KOKAI No. Sho 55-12995), N-acylimino carbonic acid compound (J.P.KOKAI No. Sho 55-126236), polymer having in the main chain orthoester groups (J.P.KOKAI No. Sho 56-17345), silyl ester compound (J.P.KOKAI No. Sho 60-10247), and silyl ether compound (J.P.KOKAI Nos.- Sho 60-37549 and 60-121446). Since quantum yield principally exceeds 1 in these combinations, high light-sensitivity is realized.

There have been also proposed systems which are stable over time at room temperature but are decomposed by heat in the presence of an acid to become alkali-soluble. Examples of such systems include a combination of a compound which produces an acid upon exposure to light and secondory or tertiary carbon (e.g. t-butyl or 2-cyclohexenyl) ester or carbonic acid ester compound disclosed in J.P.KOKAI Nos. Sho 59-45439, 60-3625, 62-229242, and 63-36240, Polym. Eng. Sci., vol. 23, page 1012, (1983), ACS.Sym.,vol.242, page 11 (1984), Semiconductor World (1987), November, page 91, Macromolecules, vol. 21, page 1475 (1988) and SPIE, vol. 920, page 42 (1988). These systems are also high in sensitivity and lower in absorption in Deep-UV regions than naphthoquinonediazide/novolak resin systems so that they can be a useful system wherein a wavelength of a light-source can be made shorter. However, since the acid generating agent used in combination does not cause photo-bleaching, the systems are not sufficient to obtain a resist pattern having a good shape.

A system comprising a combination of a silyl ether compound and a disulfone compound as an acid generating agent is disclosed in J.P.KOKAI No. Sho 61-166544 and German patent No. 3,804,533. However, the former system has disadvantage that the absorption in Deep-UV regions is large and the latter has disadvantage that alkali developability of exposed areas and dissolution inhibition of unexposed areas in the developer are not sufficient.

SUMMARY OF THE INVENTION

Accordingly, an object of the present invention is to provide a photoresist composition which makes it possible to solve the foregoing problems, particularly to provide a photoresist composition having high sensitivity and high image resolution.

More specifically, an object of the present invention is to provide a photoresist composition which is low in the absorption and photobleaching property in Deep-UV regions so that a light source emitting light of shorter wavelength can be used.

The inventors of this invention have conducted various studies to achieve the foregoing objects and have completed the present invention.

The present invention provides a positive working light-sensitive composition which comprises:

(a) 10 to 95% by weight of a compound which has at least one acid-decomposable group and whose solubility in an alkaline developer increases by the action of an acid, (b) 0.01 to 20% by weight of a disulfone compound represented by the formula (I):

$$R^1-SO_2-SO_2-R^2 \qquad (I)$$

wherein $R^1$ and $R^2$ may be same or different and represent substituted or unsubstituted alkyl groups, substituted or unsubstituted alkenyl groups or substituted or unsubstituted aryl groups, and (c) 3 to 85% by weight of a water-insoluble but alkaline watersoluble resin, wherein the optical density at 248 nm of 1 μm thick coating of the composition is not more than 1.4 and the optical density at 248 nm of the coating exposed to light of 248 nm is less than the optical density of the coating before exposed to light.

DETAILED EXPLANATION OF THE INVENTION

The present invention will now be explained in detail.

Component (a): Acid-decomposable compound

Component (a) of the present invention is a compound which has at least one acid-decomposable group and whose solubility in an alkaline developer increases by the action of an acid.

In the preferred embodiments of the present invention, the acid-decomposable compound of component (a) is a polymer having structural unit represented by the following formulas (II) to (VI):

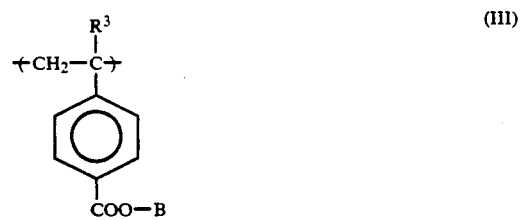

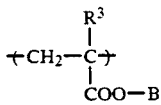

In the above formulas, $R^3$ represents hydrogen atom or an alkyl group, preferably hydrogen atom or an alkyl group having 1 to 4 carbon atoms, and more preferably hydrogen atom or methyl group, B represents —C($R^4$)($R^5$)($R^6$), —Si($R^4$)($R^5$)($R^6$) or —C($R^7$)($R^8$)—O$R^9$, A represents B or —CO—O—B, and Y represents a single bond or a divalent aromatic group, preferably a single bond or an arylene group having 6 to 15 carbon atoms, more specifically phenylene or naphthylene group.

$R^4$, $R^5$, $R^6$, $R^7$ and $R^8$ may be same or different and represent hydrogen atoms, alkyl, cycloalkyl, alkenyl or aryl groups. The alkyl groups may be linear, branched or cyclic ones and preferably have 1 to 8 carbon atoms. Specific examples include methyl, ethyl, propyl, butyl, hexyl, octyl, isopropyl, isobutyl and 2-ethylhexyl. The alkyl groups may be substituted by a halogen atom such as chlorine atom, an alkoxy group having 1 to 6 carbon atoms such as methoxy group, an aryl group such as phenyl, an aryloxy group such as phenoxy group, etc. Specific examples include monochloromethyl, dichloromethyl, trichloromethyl, bromomethyl, 2-chloroethyl, 2-bromoethyl, 2-methoxyethyl, 2-ethoxyethyl, phenylethyl and phenoxyethyl.

The cycloalkyl groups preferably have 3 to 8 carbon atoms and include cyclopropyl, cyclobutyl, cyclopentyl, cyclohexyl, cycloheptyl, cyclooctyl, cyclopentenyl and cyclohexenyl.

The alkenyl groups include vinyl group and the substituted alkenyl groups include those substituted by an alkyl group such as methyl group and an aryl group such as phenyl group, for example, 1-methylvinyl, 2-methylvinyl, 1,2-dimethlyvinyl, 2-phenylvinyl, 2-(p-methylphenyl)vinyl, 2-(p-methoxyphenyl)vinyl, 2-(p-chlorophenyl)vinyl and 2-(o-chlorophenyl)vinyl groups.

The aryl groups are preferably monocyclic or bicyclic ones such as phenyl, α-naphthyl and β-naphthyl groups. The substituted aryl groups may be those listed above which are substituted with alkyl groups having 1 to 6 carbon atoms such as methyl and ethyl groups; alkoxy groups having 1 to 6 carbon atoms such as methoxy and ethoxy groups; halogen atoms such as chlorine atom; nitro, phenyl, or cyano groups. Specific examples thereof are 4-chlorophenyl, 2-chlorophenyl, 4-bromophenyl, 4-nitrophenyl, 4-phenylphenyl, 4-methylphenyl, 2-methylphenyl, 4-ethylphenyl, 4-methoxyphenyl, 2-methoxyphenyl, 4-ethoxyphenyl, 4-cyanophenyl, 4-methyl-1-naphtyl, 4-chloro-1-naphthyl, 5-nitro1-naphthyl, 5-hydroxy-1-naphthyl, 6-chloro-2-naphthyl and 4-bromo-2-naphthyl groups.

$R^9$ is an alkyl or an aryl group, preferably an alkyl group having 1 to 20 carbon atoms or an aryl group having 6 to 15 carbon atoms, more preferably an alkyl group having 1 to 8 carbon atoms or an aryl group having 6 to 10 carbon atoms as well as these listed above which are substituted with a halogen atom, an alkoxy, nitro or cyano group. At least two of $R^4$ to $R^6$ are not hydrogen atoms and two of $R^4$ to $R^6$ or two of $R^7$ to $R^8$ may combine to form a ring.

Specific examples of the compounds having at least one acid-decomposable group used in the present invention include the polymers such as poly (p-t-butyl carbonyloxy styrene) as disclosed in J.P.KOKAI No. Sho 59-45439 (U.S. Pat. No. 4,491,628); polymers such as poly[N-(t-butoxycarbonyl) maleimide-co-styrene]as disclosed in J.P.KOKAI No. Sho 62-29242 and SPIE, vol. 631, page 68 (1986); polymers such as poly[N-(p-t-butoxycarbonyloxyphenyl)maleimide-co-styrene] as disclosed in J.P.KOKAI No. Sho 63-36240 (=EP-A-0254853) and ACS Symp., vol. 346, page 200 (1987); polymers such as poly(t-butyl p-vinylbenzoate) as disclosed in SPIE, vol. 771, page 24 (1987); polymers such as poly(t-butyl methacrylate), poly(2-cyclohexenyl methacrylate), poly(2-cyclopropyl-propyl methacrylate) and poly(2-phenyl-propyl methacrylate) as disclosed in Macromolecules, vol. 21, page 14755 (1988); polymers such as poly(p-trimethylsiloxy styrene) as disclosed in J.P.KOKAI No. Sho 60-52845 and U.S. Pat. No. 4,689,288 and SPIE, vol. 926, page 162 (1988); polymers such as poly(p-t-butoxy styrene) as disclosed in J.P.KOKAI No. Sho 63-250642 (=EP-A-0284868) and EP-A-0366590; polymers such as poly(p-2-cyclohexenyloxy styrene) as disclosed in Polymer Bull., vol.20, page 427 (1988); polymers such as poly(p-2-pyranyloxy styrene) as disclosed in ACS Polym. Mater. Sci. Tech., vol. 61, page 417 (1989); and polymers such as poly(silyl methacrylate) as disclosed in J.P.KOKAI No. Sho 62-40450 (=U.S. Pat. No. 4,820,607). In addition, there may be used poly phthaldehydes as disclosed in ACS Symp., vol. 242, page 11 and polycarbonates as disclosed in J.P.KOKAI No. Sho 62-136638 (=EP-A-0225454), J. Imaging Sci., vol. 30, page 59 (1986) and Makromol. Chem., Rapid Commun., vol. 7, page 121 (1986).

A weight average molecular weight of these polymers is preferably not less than 500 and more preferably in a range of from 1,000 to 500,000.

An amount of the component (a) contained in the light-sensitive composition of the present invention is in a range of from 10 to 95%, preferably 20 to 90% and more preferably 25 to 75% by weight based on the total weight of the composition.

Component (b); Disulfone compound

Component (b) of the present invention is a disulfone compound of the formula (I).

In the formula (I), the alkyl groups may be linear, branched or cyclic ones and preferably have 1 to 10 carbon atoms. Specific examples include methyl, ethyl, propyl, butyl, hexyl, octyl, decyl, isopropyl, isobutyl, t-butyl, 2-ethylhexyl and cyclohexyl. The alkyl groups may be substituted by a halogen atom such as chlorine atom, an alkoxy group having 1 to 6 carbon atoms such as methoxy group, an aryl group such as phenyl group, an aryloxy group such as phenoxy group, etc. Specific examples include monochloromethyl, dichloromethyl, trichloromethyl, bromomethyl, 2-chloroethyl, 2-bromoethyl, 2-methoxyethyl, 2-ethoxyethyl, phenylethyl, naphthylmethyl and phenoxyethyl.

The alkenyl groups include vinyl group and the substituted alkenyl groups include those substituted by an alkyl group such as methyl group and an aryl group such as phenyl group, for example, 1-methylvinyl, 2-methylvinyl, 1,2-dimethlyvinyl, 2-phenylvinyl, 2-(p-methylphenyl)vinyl, 2-(p-methoxyphenyl)vinyl, 2-(p-chlorophenyl)vinyl and 2-(o-chlorophenyl)vinyl groups.

The aryl groups are preferably monocyclic or bicyclic ones such as phenyl, α-naphthyl and β-naphthyl groups. The substituted aryl groups may be those listed above which are substituted with alkyl groups having 1 to 6 carbon atoms such as methyl and ethyl groups; alkoxy groups having 1 to 6 carbon atoms such as methoxy and ethoxy groups; halogen atoms such as chlorine atom; nitro, phenyl, carboxy, hydroxy, amide, imide or cyano groups. Specific examples thereof are 4-chlorophenyl, 2-chlorophenyl, 4-bromophenyl, 4-nitrophenyl, 4-hydroxyphenyl, 4-phenylphenyl, 4-methylphenyl, 2-methylphenyl, 4-ethylphenyl, 4-methoxyphenyl, 2-methoxyphenyl, 4-ethoxyphenyl, 2-caboxyphenyl, 4-cyanophenyl, 4-methyl-1-naphtyl, 4-chloro-1-naphthyl, 5-nitro-1-naphthyl, 5-hydroxy-1-naphthyl, 6-chloro-2-naphthyl, 4-bromo-2-naphthyl and 5-hydroxy-2-naphthyl groups.

The disulfone compounds of the formula (I) used in the present invention can be prepared according to the processes as disclosed in, for instance, G. C. Denser, Jr. et al. "Journal of Organic Chemistry", vol. 31, pp. 3418–3419 (1966); T. P. Hilditch "Journal of the Chemical Society", vol. 93, pp. 1524–1527 (1908); and O. Hinsberg "Berichte der Deutschen Chemischen Gesellschaft", vol. 49, pp. 2593–2594 (1916). More specifically, there may be derived from a sulfinic acid of the formula (VII) using cobalt sulfate; or a sulfonic chloride of the formula (VIII) using ethyl xantogenate; or a reaction between the sulfinic acid of the formula (VII) and the sulfonic chloride of the formula (VIII) under alkaline conditions:

$$R^1-SO_2H \quad (VII)$$

$$R^2-SO_2Cl \quad (VIII)$$

wherein $R^1$ and $R^2$ have the same meaning as defined above for the formula (I).

Specific examples of the compounds of the formula (I) used in the present invention are illustrated below.

(I-1)

(I-2)

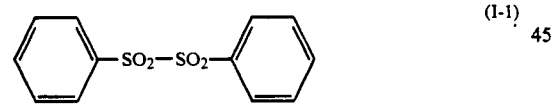
(I-3)

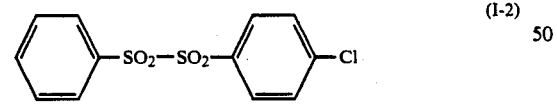
(I-4)

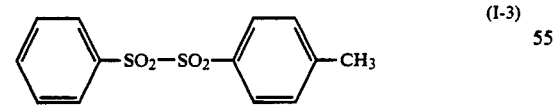
(I-5)

-continued

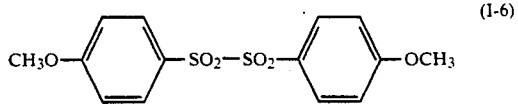
(I-6)

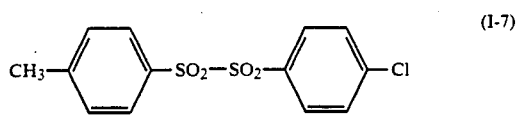
(I-7)

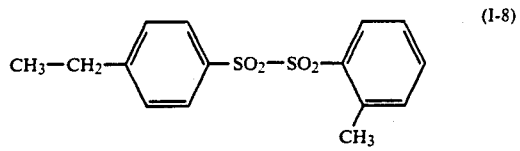
(I-8)

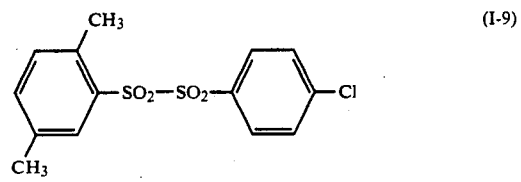
(I-9)

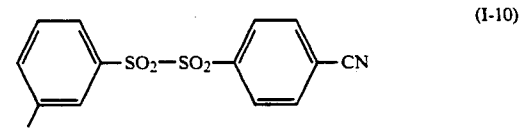
(I-10)

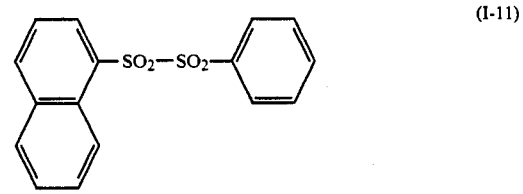
(I-11)

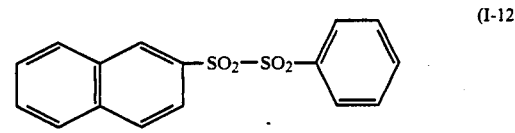
(I-12)

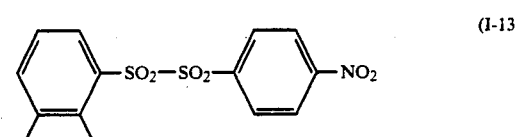
(I-13)

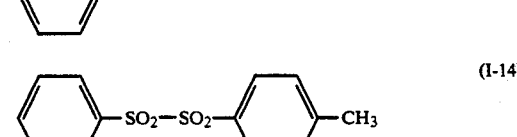
(I-14)

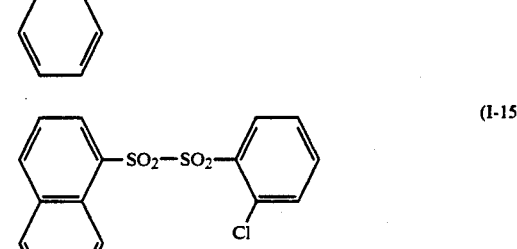
(I-15)

-continued
(I-16) 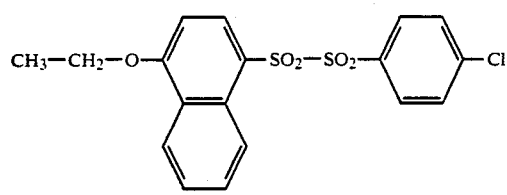
(I-17) 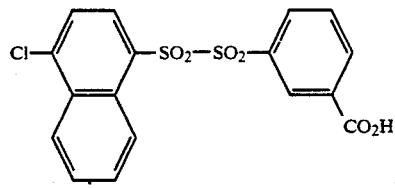
(I-18) 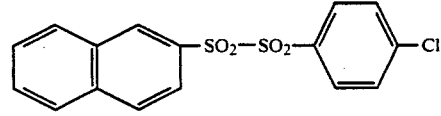
(I-19) 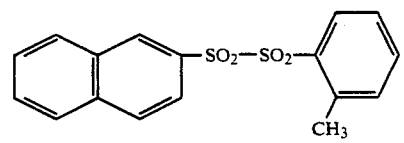
(I-20) 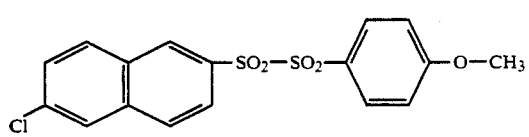
(I-21) 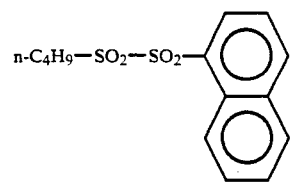
(I-22) 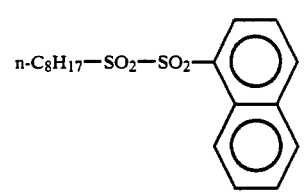
(I-23) 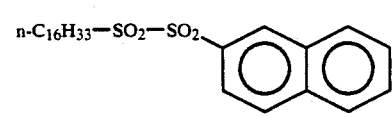
(I-24) 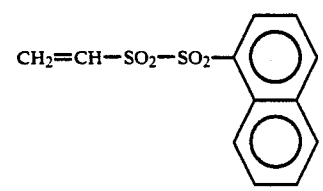
-continued
(I-25) 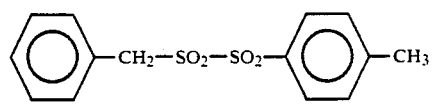
(I-26) 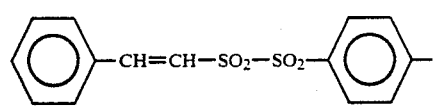
(I-27) 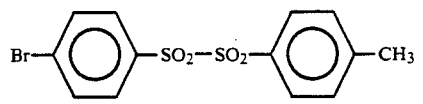
(I-28) 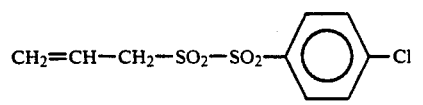
(I-29) 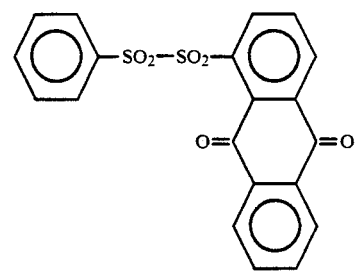
(I-30) 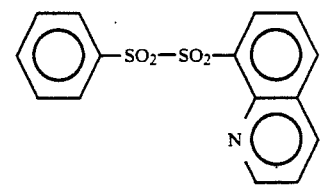
(I-31) 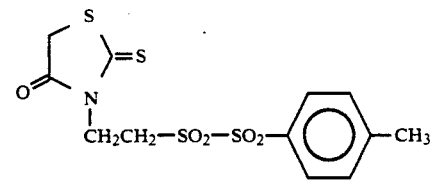
(I-32) 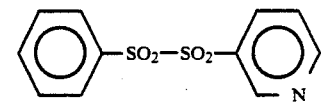
(I-33) 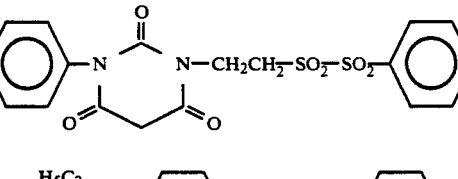
(I-34) 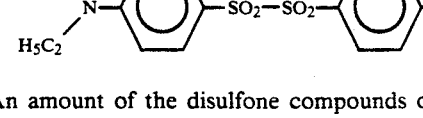
An amount of the disulfone compounds of the formula (I) contained in the light-sensitive composition of the present invention is in a range of from 0.01 to 20%, preferably 0.5 to 15% and more preferably 1 to 10% by weight based on the total weight of the composition.

Component (c): Alkali-soluble polymers

The alkali-soluble polymers usable in the present invention are preferably those having an acidic hydrogen atom having pKa of not more than 11, such as a phenolic hydroxyl group, carboxylic acid group, sulfonic acid group, imido group, sulfonamido group, N-sulfonylamido group, N-sulfonylurethane group or active methylene group. Suitable alkali-soluble polymers include, for example, novolak-type, phenolic resins such as phenol/formaldehyde resin, o-cresol/formaldehyde resin, m-cresol/formaldehyde resin, p-cresol/formaldehyde resin, xylenol/formaldehyde resin and copolycondensates of them. It is possible to use the phenolic resin in combination with a phenol/formaldehyde or cresol/formaldehyde condensate substituted with an alkyl group having 3 to 8 carbon atoms such as t-butylphenol/formaldehyde resin. In addition, there may also be used polymers comprising, as a comonomer, a phenolic hydroxy group-containing monomer such as N-(4-hydroxyphenyl) methacrylamide and homo- or copolymers of p-hydroxystyrene, o-methacrylamid hydroxystyrene, m-isopropenyl phenol, p-isopropenyl phenol, etc.; the above-mentioned polymers partially etherified or partially esterified.

Further, there may also be used polymers of carboxyl group-containing monomers such as acrylic acid and methacrylic acid, carboxyl group-containing polyvinylacetal resin described in J.P. KOKAI No. 61-267042 and carboxyl group-containing polyurethane resin described in J.P. KOKAI No. 63-124047 (=U.S. Pat. No. 4,898,803).

In addition, there may also be used polymers comprising N-(4-sulfamoylphenyl) methacrylamide, N-phenylsulfonyl methacrylamide or maleimide as a comonomer, and polymers having an active methylene group described in J.P. KOKAI No. 63-27237.

These alkali-soluble polymers can be used alone or in combination. An amount of the alkali-soluble polymer (c) contained in the light-sensitive composition of the present invention is in a range of from 3 to 85%, preferably 5 to 75% and more preferably 10 to 65% by weight based on the total solid weight of the composition.

The light-sensitive composition of the present invention comprises the components (a), (b) and (c) in the amounts described above, wherein the optical density at 248 nm of 1 μm thick coating of the composition is not more than 1.4, preferably not more than 1.3 and more preferably 1.0 and the optical density at 248 nm of the coating exposed to light of 248 nm is less than the optical density of the coating before exposed to light.

(Other additives)

The positive working light-sensitive composition of the present invention may optionally contain a dye, pigment, plasticizer and a compound (sensitizer) enhancing the efficiency of the photolysis.

The sensitizers include, for example, benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzil, dibenzalacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino)benzophenone and benzanthrone. Among these compounds, the Michler's ketone is particularly preferable.

Preferred sensitizers usable in the present invention further include compounds of the following general formula (IX) described in J.P. KOKOKU No. 51-48516:

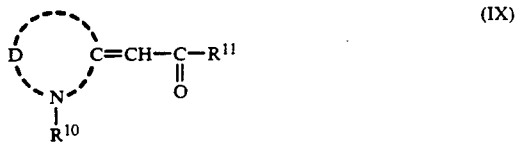

wherein $R^{10}$ represents an alkyl group (such as methyl, ethyl or propyl group) or a substituted alkyl group (such as 2-hydroxyethyl, 2-methoxyethyl, carboxymethyl or 2-carboxyethyl group), $R^{11}$ represents an alkyl group (such as methyl or ethyl group) or an aryl group (such as phenyl, p-hydroxyphenyl, naphthyl or thienyl group), and D represents a non-metallic atomic group necessary for forming a nitrogen-containing heterocyclic ring of an ordinary cyanine dye such as a benzothiazole (for example, benzothiazole, 5-chlorobenzothiazole or 6-chlorobenzothiazole), a naphthothiazole (for example, α-naphthothiazole or β-naphthothiazole), a benzoselenazole (for example, benzoselenazole, 5-chlorobenzoselenazole or 6-m ethoxybenzoselenazole), a naphthoselenazole (for example, α-naphthoselenazole or β-naphthoselenazole), a benzoxazole (for example, benzoxazole, 5-methylbenzoxazole or 5-phenylbenzoxazole) or naphthoxazole (for example, α-naphthoxazole or β-naphthoxazole).

The compounds of the general formula (IX) have chemical structures having a combination of D, $R^{10}$ and $R^{11}$. Various compounds of the general formula (IX) are known. Therefore, the compound of the general formula (IX) is suitably selected from the known compounds.

Preferred sensitizers usable in the present invention include those described in U.S. Pat. Nos. 4,062,686 such as 2-[bis(2-furoyl)methylene]-3-methylbenzothiazoline, 2-[bis(2-thienoyl)methylene]-3-methylbenzothiazoline and 2-[bis(2-furoyl)methylene]3-methylnaphtho[1,2-d]thiazoline.

Dyes can be used as a colorant. Preferred dyes are oil-soluble dyes and basic dyes. Examples of such dyes include Oil Yellow #101, Oil Yellow #130, Oil Pink #312, Oil Green BG, Oil Blue BOS, Oil Blue #603, Oil Black BY, Oil Black BS and Oil Black T-505 (products of Orient Kagaku Kogyo Co.), Crystal Violet (CI 42555), Methyl Violet (CI 42535), Rhodamine B (CI 45170B), Malachite Green (CI 42000) and Methylene Blue (CI 52015).

The composition of the present invention may contain also a cyclic acid anhydride for further increasing the sensitivity, a printing-out agent for forming a visible image immediately after the exposure, and a filler. The cyclic acid anhydrides include, for example, phthalic anhydride, tetrahydrophthalic anhydride, hexahydrophthalic anhydride, 3,6-endoxy-Δ⁴-tetrahydrophthalic anhydride, tetrachlorophthalic anhydride, maleic anhydride, chloromaleic anhydride, α-phenylmaleic anhydride, succinic anhydride and pyromellitic acid as described in U.S. Pat. No. 4,115,128. The sensitivity can be increased three times as much as by incorporating 1 to 15% by weight based on the total composition, of the cyclic acid anhydride. The typical example of the printing-out agent for forming the visible image immediately after the exposure is a combination of a light-sensitive compound which releases an acid upon exposure with a salt-forming organic dye. Examples of them include a combination of an o-naphthoquinone diazide-4-sulfonyl halide with a salt-forming organic dye as described in J.P. KOKAI Nos. 50-36209 (=U.S. Pat. No. 3,969,118) and 53-8128 and a combination of a trihalomethyl compound with a salt-forming organic dye, as described in J.P. KOKAI Nos. 53-36223 (=U.S. Pat. No. 4,160,671) and 54-74728 (=U.S. Pat. No. 4,232,106).

Solvents

The positive working light-sensitive composition of the present invention is dissolved in a solvent and the solution as it is can be applied to a support to prepare a resist material for semiconductor elements. The solvents usable herein include, for example, ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 2-ethoxyethyl acetate, 1-methoxy-2-propyl acetate, dimethoxy ethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and ethyl acetate. These solvents may be used alone or in combination.

The concentration of the solvent in the composition (total solid components including the additives) is 2 to 50% by weight.

Actinic rays or radiant rays

Actinic ray sources usable in the present invention include, for example, mercury lamp, metal halide lamp, xenon lamp, chemical lamp and carbon arc lamp. Radiant ray sources include electron rays, X-rays, ion beams and far-ultraviolet rays. Preferably, g-rays, i-rays and Deep-UV rays are used for a photoresist. Further, a scanning exposure method using a high-density energy beam (laser beam or electron rays) can also be employed for the exposure of the light-sensitive composition of the present invention. The laser beams include, for example, helium/neon laser, argon laser, krypton ion laser, helium/cadmium laser and KrF excimer laser.

Developers

The developer for the positive working light-sensitive composition of the present invention is preferably an aqueous solution of an inorganic alkali such as sodium silicate, potassium silicate, sodium hydroxide, potassium hydroxide, lithium hydroxide, sodium tertiary phosphate, disodium hydrogenphosphate, ammonium tertiary phosphate, diammonium hydrogenphosphate, sodium metasilicate, sodium bicarbonate or aqueous ammonia or an organic alkali such as an OH salt of tetraalkylammonium. An amount of the alkali is in a range of from 0.1 to 10%, preferably 0.5 to 5% by weight based on the developer.

If necessary, a surfactant or an organic solvent such as an alcohol can be added to the alkaline aqueous solution.

The positive working light-sensitive composition of the present invention is high in sensitivity, good in response to a light source of shorter wavelength in Deep-UV regions and excellent in image resolution.

EXAMPLES

The following Examples will further illustrate the present invention, which by no means limit the scope of the present invention.

EXAMPLE 1

Meta- and para-cresol novolak resin (molecular weight: 3380, meta/para ratio: 50/50) (2 g) and the disulfone compound of the formula I-14 (0.2 g) were dissolved in dimethyl acetamide (DMAc) (6.0 g). The solution was filtered through a membrane filter having a pore size of 0.4μm to prepare a light-sensitive composition. The optical density of the composition was measured at 248 nm to give about 1.2 $\mu m^{-1}$ before the exposure to light of 248 nm and about 0.9 $\mu m^{-1}$ after the exposure. The light-sensitive composition was applied to a 3 inch bare silicon treated with hexamethyl disilazane and pre-baked for 90° C. on a hot plate maintained at 100° C. to prepare a coating film of about 8000Å in thickness. The exposure was conducted using a contact aligner (PLA501F manufactured by CANON) provided with a low pressure mercury lamp as a light source and a band pass filter which transmits far-ultraviolet rays of 254 nm. After the exposure to light in a contact mode, paddle development was conducted for 60 seconds in a 1.43% aqueous solution of tetramethylammonium hydroxide (hereinafter referred to as TMAH) to obtain a positive image with the degree of the coating film unremoved in unexposed areas being 95%. Eta sensitivity (the minimum exposure energy required to form an image, i.e., to remove the resist in light-exposed areas) was about 50 mj/cm$^2$ and image resolution was 0.75μm L/S.

EXAMPLE 2

Meta- and para-cresol novolak resin (molecular weight: 3400, meta/para ratio: 50/50) (1.2 g) and an alkali-soluble polymer (molecular weight: about 8000) (0.8 g) of the following formula:

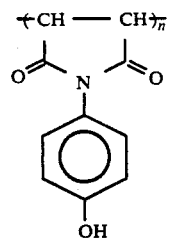

were mixed, to which the disulfone compound of the formula I-7 (0.2 g: 10% based on the resin weight). The mixture was dissolved in DMAc (7.9 g). In the same manner as in Example 1, the solution was filtered through a membrane filter having a pore size of 0.4 μm to prepare a light-sensitive composition. The optical density of the composition was measured at 248 nm to give about 1.0 μm $^{-1}$ before the exposure to light of 248 nm and about 0.8 μm $^{-1}$ after the exposure. In the same manner as in Example 1, the light-sensitive composition was applied to a silicon wafer to prepare a coating film of about 8000 Å in thickness. After the exposure, paddle development was conducted for 45 seconds in a 1.19% TMAH solution to obtain a positive image with the degree of the coating film unremoved being 90%. Eta sensitivity was about 30 mj/cm$^2$ and image resolution was 0.75 μm L/S.

EXAMPLE 3

Meta- and para-cresol novolak resin (molecular weight: about 6000, meta/para ratio: 60/40) (1.4 g), a silyl ether polymer (a degree of the silyl etherification: 27.5%) (1.4 g) of the following formula:

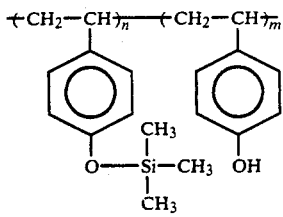

and the disulfone compound of the formula I-16 (0.12 g) were dissolved in DMAc (7.5 g). In the same manner as in Example 1, the solution was filtered through a membrane filter having a pore size of 0.4 μm to prepare a light-sensitive composition. The optical density of the composition was measured at 248 nm to give about 0.79 μm $^{-1}$ before the exposure to light of 248 nm and about 0.73 μm $^{-1}$ after the exposure. In the same manner as in Example 1, the light-sensitive composition was applied to a silicon wafer to prepare a coating film of about 8000 Å in thickness. After the exposure in the same manner as in Example 1, paddle development was conducted for 45 seconds in a 1.19% TMAH solution to obtain a positive image with the degree of the coating film unremoved being 90%. Eta sensitivity was 20 mj/cm$^2$ and image resolution was 0.7 μm L/S.

EXAMPLE 4

The same procedures as in Example 3 were repeated except that the disulfone compound of the formula I-13 (0.3 g) was substituted for the disulfone compound of the formula I-16 (0.12 g) to prepare a light-sensitive composition. The optical density of the composition was measured at 248 nm to give about 1.0μm$^{-1}$ before the exposure to light of 248 nm and about 0.85 μm$^{-1}$ after the exposure. In the same manner as in Example 1, the image forming property of the light-sensitive composition was evaluated using a 1.19% TMAH solution. Eta sensitivity was 65 mj/cm$^2$ and image resolution was 0.8μm L/S.

EXAMPLES 5 to 10

A silyl ether polymer of the following formula:

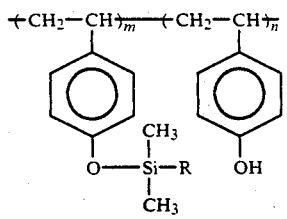

was mixed with m/p cresol/novolak resin and disulfone compound in a ratio as shown in Table 1 to prepare a light-sensitive composition. In the same manner as in Example 1, coating, exposure to light and development were conducted to evaluate the image forming property of the light-sensitive composition. The results are shown in Table 2. In all cases, the minimum size of 0.7 μm in the mask was resolved.

TABLE 1

| Ex. No. | (A)[1] (mol %) | (B)[2] (mol %) | (C)[3] | Ratio A/B | Ratio B/C | O.D. (μm$^{-1}$)[4] before | O.D. (μm$^{-1}$)[4] after | Dev.[5] sol. (%) | Dev. time (sec) |
|---|---|---|---|---|---|---|---|---|---|
| 5 | | 37.8 | I-11 | 0/100 | 8/1 | 0.61 | 0.59 | 2.38 | 30 |
| 6 | | 37.8 | I-11 | 20/80 | 8/1 | 0.75 | 0.70 | 2.38 | 30 |
| 7 | | 37.8 | I-11 | 50/50 | 8/1 | 0.80 | 0.75 | 2.38 | 40 |
| 8 | | 20.5 | I-15 | 0/100 | 8/1 | 0.7 | 0.66 | 1.67 | 30 |
| 9 | | 20.5 | I-15 | 20/80 | 8/1 | 0.73 | 0.70 | 1.67 | 40 |
| 10 | | 20.5 | I-15 | 50/50 | 8/1 | 0.79 | 0.72 | 1.67 | 40 |

[1](A): m/p cresol novolak resin (m/p = 50/50, molecular weight = 6000)
[2](B): silyl ether polymer (R = CH$_3$) (degree of silyl etherification (mol %) = 37.8 or 20.5)
[3](C): Disulfone compound
[4]O.D.: Optical density before and after the exposure to light
[5]Developing solution containing TMAH

TABLE 2

| Example No. | Eta (mj/cm$^2$) | Image resolution (μm) | Degree of unremoved film (%) |
|---|---|---|---|
| 5 | 15 | 0.7 | 93.0 |
| 6 | 25 | 0.7 | 95.0 |
| 7 | 30 | 0.7 | 95.0 |
| 8 | 15 | 0.7 | 90.0 |
| 9 | 20 | 0.7 | 90.0 |
| 10 | 30 | 0.7 | 93.5 |

What is claimed is:

1. A positive working light-sensitive composition which comprises:
   (a) 10 to 95% by weight of a compound which has at least one acid-decomposable group and whose solubility in an alkaline developer increases by the action of an acid,
   (b) 0.01 to 20% by weight of a disulfone compound represented by the formula (I):

$$R^1-SO_2\text{-}SO_2-R^2 \qquad (I)$$

wherein R$^1$ and R$^2$ may be same or different and represent substituted or unsubstituted alkyl groups, substituted or unsubstituted alkenyl groups or substituted or unsubstituted aryl groups, and
   (c) 3 to 85% by weight of a water-insoluble but alkaline watersoluble resin,
   wherein the optical density at 248 nm of 1 μm thick coating of the composition is not more than 1.4 and the optical density at 248 nm of the coating exposed to light of 248 nm is less than the optical density of the coating before exposed to light.

2. The positive working light-sensitive composition of claim 1, wherein the compound which has at least one acid-decomposable group is a polymer having at least one structural unit represented by the following formulas (II) to (VI):

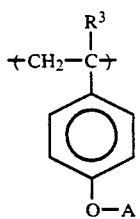 (II)

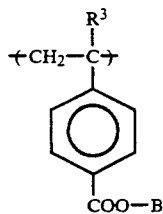 (III)

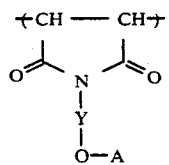 (IV)

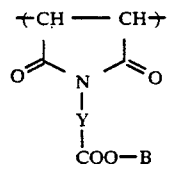 (V)

and

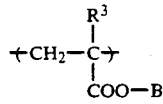 (VI)

wherein $R^3$ represents hydrogen atom or an alkyl group,

B represents —C($R^4$)($R^5$)($R^6$), —Si($R^4$)($R^5$)($R^6$) or —C($R^7$)($R^8$)—O$R^9$, A represents B or —CO—O—B, Y represents a single bond or a divalent aromatic group, wherein $R^4$, $R^5$, $R^6$, $R^7$ and $R^8$ may be same or different and represent hydrogen atoms, alkyl, cycloalkyl, alkenyl or aryl groups, and $R^9$ is an alkyl or an aryl group, provided that at lest two of $R^4$ to $R^6$ are not hydrogen atoms and two of $R^4$ to $R^6$ or two of $R^7$ to $R^9$ may combine to form a ring.

3. The positive working light-sensitive composition of claim 1, wherein the compound which has at least one acid-decomposable group is selected from the group consisting of poly(p-t-butyl carbonyloxy styrene), poly[N-(t-butoxycarbonyl)maleimide-costyrene], poly[N-(p-t-butoxycarbonyloxyphenyl)maleimide-costyrene], poly(t-butyl p-vinylbenzoate), poly(t-butyl methacrylate, poly(2-cyclohexenyl methacrylate), poly(2-cyclopropyl-propyl methacrylate) and poly(2-phenyl-propyl methacrylate), poly(p-trimethylsiloxy styrene), poly(p-t-butoxy styrene), poly(p-2-cyclohexenyloxy styrene), poly(p-2-pyranyloxy styrene), poly(-silyl methacrylate), poly phthaldehydes and polycarbonates.

4. The positive working light-sensitive composition of claim 1, wherein the compound which has at least one acid-decomposable group has a weight average molecular weight in a range of from 1,000 to 500,000.

5. The positive working light-sensitive composition of claim 1, wherein the compound which has at lest one acid-decomposable group is contained in a range of from 10 to 95% by weight based on the total weight of the composition.

6. The positive working light-sensitive composition of claim 1, wherein the disulfone compound is selected from the group consisting of those represented by the formula (I) wherein the alkyl group is a linear, branched or cyclic group having 1 to 10 carbon atoms or a linear, branched or cyclic group having 1 to 10 carbon atoms substituted by a halogen atom, an alkoxy group having 1 to 6 carbon atoms an aryl group or an aryloxy group; the alkenyl group is vinyl group or an alkenyl group substituted by an alkyl group or an aryl group; and the aryl group is monocyclic or bicyclic one or monocyclic or bicyclic one substituted with an alkyl group having 1 to 6 carbon atoms, an alkoxy group having 1 to 6 carbon atoms, a halogen atom, a nitro, phenyl, carboxy, hydroxy, amide, imide or cyano group.

7. The positive working light-sensitive composition of claim 1, wherein the disulfone compound is selected from the group consisting of those represented by the following formulas:

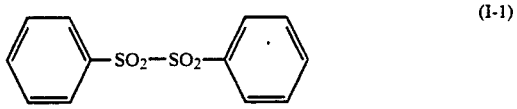 (I-1)

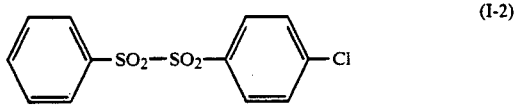 (I-2)

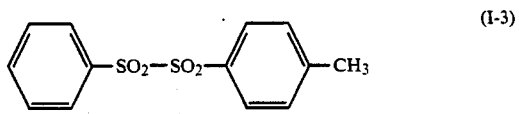 (I-3)

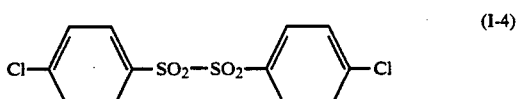 (I-4)

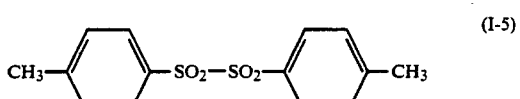 (I-5)

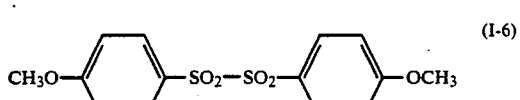 (I-6)

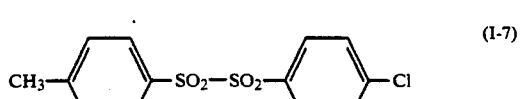 (I-7)

-continued
(I-8) 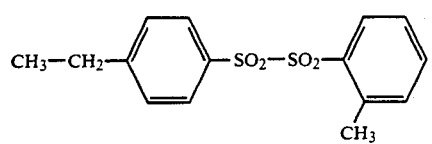
(I-9) 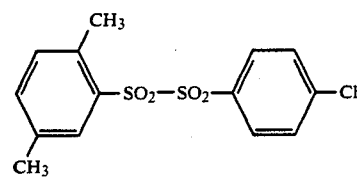
(I-10) 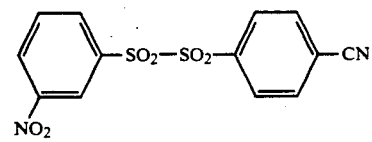
(I-11) 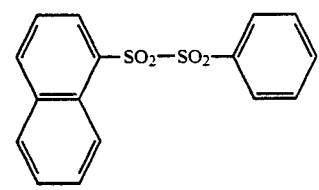
(I-12) 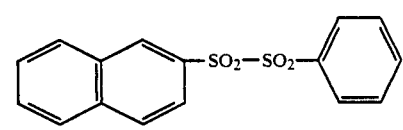
(I-13) 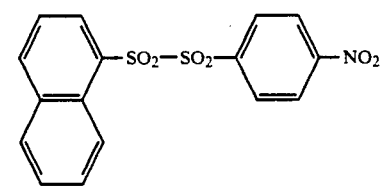
(I-14) 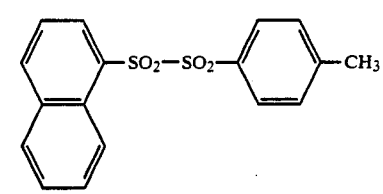
(I-15) 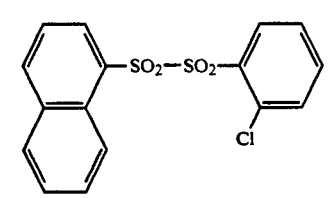
(I-16) 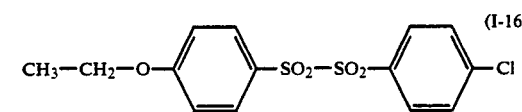
-continued
(I-17) 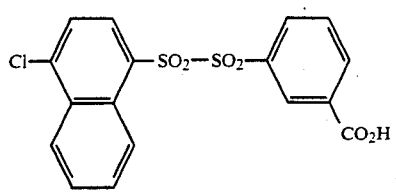
(I-18) 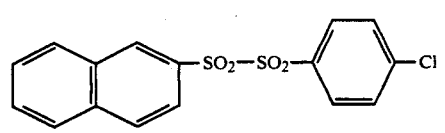
(I-19) 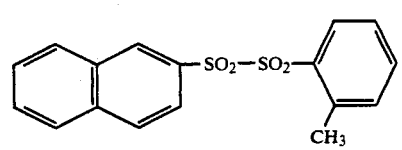
(I-20) 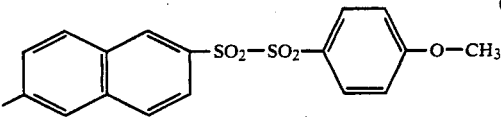
(I-21) 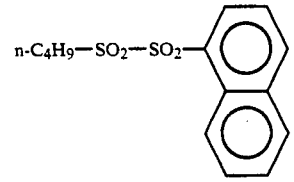
(I-22) 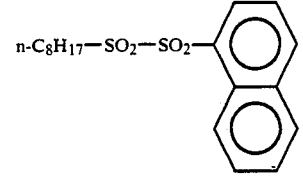
(I-23) 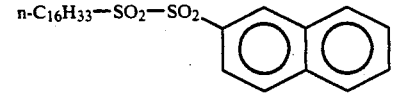
(I-24) 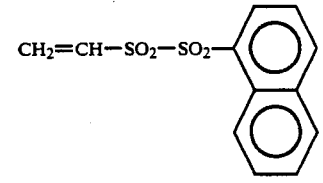
(I-25) 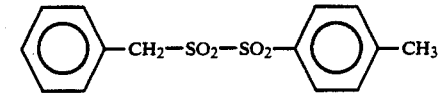
(I-26) 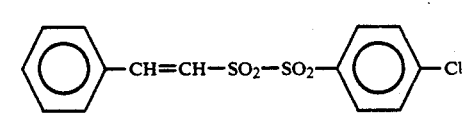

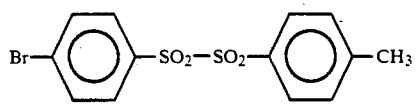 (I-27)

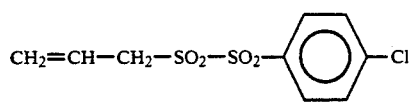 (I-28)

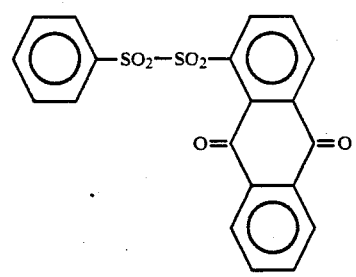 (I-29)

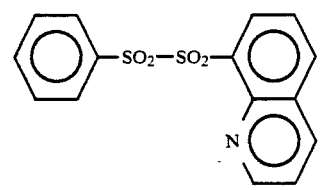 (I-30)

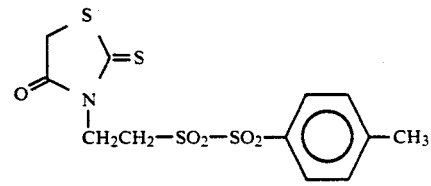 (I-31)

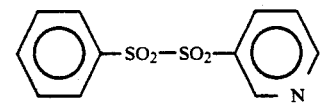 (I-32)

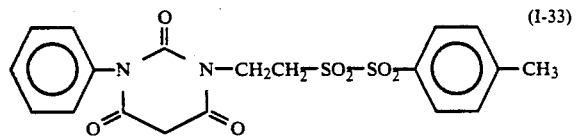 (I-33)

and

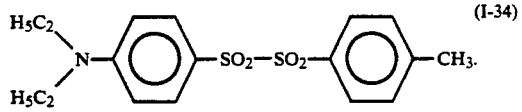 (I-34)

8. The positive working light-sensitive composition of claim 1, wherein the alkali-soluble polymer is one which has an acidic hydrogen atom having pKa of not more than 11 selected from the group consisting of a phenolic hydroxyl group, carboxylic acid group, sulfonic acid group, imido group, sulfonamido group, N-sulfonylamido group, N-sulfonylurethane group and active methylene group.

9. The positive working light-sensitive composition of claim 1, wherein the alkali-soluble polymer is selected from the group consisting of novolak-type phenolic resins; combinations of the novolak-type phenolic resins with a phenol-formaldehyde or cresol-formaldehyde condensate substituted with an alkyl group having 3 to 8 carbon atoms; polymers comprising, as a comonomer, a phenolic hydroxy group-containing monomer; the above-mentioned polymers partially etherified or partially esterified; polymers of carboxyl group-containing monomers; carboxyl group-containing polyvinylacetal resins; carboxyl group-containing polyurethane resins; polymers comprising N-(4-sulfamoylphenyl) methacrylamide, N-phenylsulfonyl methacrylamide or maleimide as a comonomer; and polymers having an active methylene group.

10. The positive working light-sensitive composition of claim 1, wherein the optical density at 248 nm of 1 μm thick coating of the composition is not more than 1.3.

11. The positive working light-sensitive composition of claim 1, wherein the optical density at 248 nm of 1 μm thick coating of the composition is not more than 1.0.

12. The positive working light-sensitive composition of claim 1, wherein the composition further contains at least one selected from the group consisting of a dye, pigment, plasticizer and a compound (sensitizer) enhancing the efficiency of the photolysis of the composition.

13. The positive working light-sensitive composition of claim 1, wherein the sensitizer is selected from the group consisting of benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzil, dibenzalacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino)benzophenone and benzanthrone.

14. The positive working light-sensitive composition of claim 1, wherein the composition is dissolved in a solvent selected from the group consisting of ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 2-ethoxyethyl acetate, 1-methoxy-2-propyl acetate, dimethoxy ethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and ethyl acetate.

15. A semiconductor device comprising the positive working light-sensitive composition of claim 1.

* * * * *